United States Patent [19]

Yanaka et al.

[11] Patent Number: 4,596,934

[45] Date of Patent: Jun. 24, 1986

[54] ELECTRON BEAM APPARATUS WITH IMPROVED SPECIMEN HOLDER

[75] Inventors: Takashi Yanaka, Hino; Kazuo Ohsawa, Sagamihara; Mitsusuke Kyogoku, Hino, all of Japan

[73] Assignee: International Precision Inc., Hachiohji, Japan

[21] Appl. No.: 479,172

[22] Filed: Mar. 28, 1983

[30] Foreign Application Priority Data

Mar. 30, 1982 [JP] Japan .................................. 57-50019

[51] Int. Cl.$^4$ .............................................. G21K 5/10
[52] U.S. Cl. ................................ 250/442.1; 250/440.1
[58] Field of Search .................... 250/440.1, 442.1, 311

[56] References Cited

U.S. PATENT DOCUMENTS 3,218,457 11/1965 Van Dorsten .................... 250/442.1

OTHER PUBLICATIONS

"A Container for Handling Small Specimens Having Preparation and Examination in the Scanning Electron Microscope (SEM)", Taylor, *Journ. of Microscopy*, vol. 105, Dec. 1975, pp. 335–338.

"Target Foil Motion", Corwin, *Nucl. Inst. and Methods*, No. 1, Jul. 1976, pp. 41–45.

*Primary Examiner*—Bruce C. Anderson
*Attorney, Agent, or Firm*—Warren B. Kice

[57] ABSTRACT

In an electron beam apparatus such as a transmission electron microscope, a specimen holder device which comprises a specimen holder member and a holding rod connected thereto is withdrawably inserted in a pole-gap defined between upper and lower poles of an objective lens of the electron beam apparatus. An opening having a greater diameter than that of the pole end face is formed in the specimen holding member at a center portion for receiving therein a specimen mesh of a reduced thickness. A recess is formed in the specimen holding member at that portion which is caused to pass between the upper and lower magnetic poles upon insertion and withdrawal of the specimen to and from the interpole gap so that a region resulting from the formation of the recess has a reduced thickness as compared with the remaining region of the specimen holder member. Inter-pole gap of the objective lens is thus reduced to increase resolving power thereof. The specimen holder member can be mounted in a frame-like supporting member rotatably about an axis which extends perpendicularly to the center axis of the holding rod, while the frame-like supporting member being inclinable around the axis of the holding rod.

7 Claims, 6 Drawing Figures

PRIOR ART

FIG. 6

ELECTRON BEAM APPARATUS WITH IMPROVED SPECIMEN HOLDER

BACKGROUND OF THE INVENTION

1. FIELD OF THE INVENTION

The present invention relates generally to an electron beam apparatus and more particularly to a specimen holder of an improved structure used in the electron beam apparatus.

2. DESCRIPTION OF THE PRIOR ART

Figure 1:
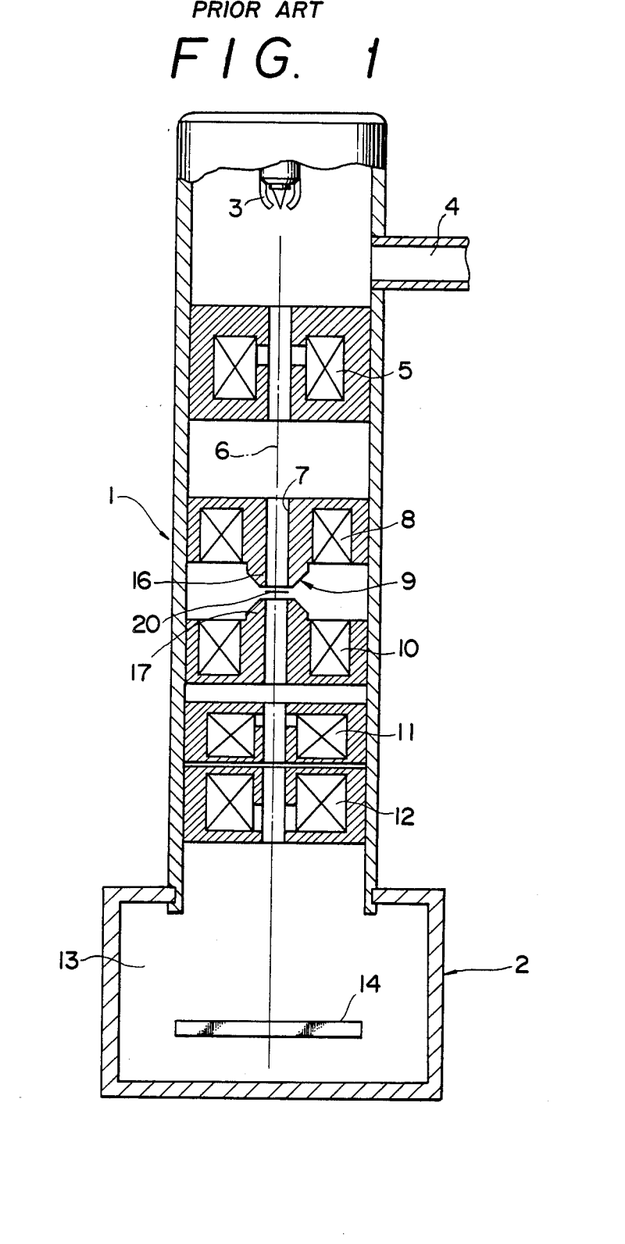
FIG. 1 shows in a sectional view a structure of a hitherto known transmission electron microscope.

As a typical one of the electron beam apparatus, there may be mentioned a transmission electron microscope whose known structure is shown in FIG. 1, by way of example. The illustrated transmission microscope is composed of a microscope column 1 which includes an electron gun 3, a condenser lens 5, an objective lens 9 provided with excitation coils 8 and 10 and disposed below the condenser lens 5, an intermediate lens 11 and a projection lens 12, both being located below the objective lens 9 and a viewing chamber enclosure 2 mounted fixedly below the microscope column 1 and defining a hollow chamber 13 in which a fluorescent screen 14 is disposed. In the microscope column 1, there is formed a center bore 7 which extends longitudinally along a beam axis 6 of electrons emitted by the electron gun (which axis will hereinafter be referred to as the optical axis). The objective lens 9 includes an upper magnetic pole piece 16 excited by the excitation coil 8 and a lower pole piece 17 disposed below the upper pole piece 16 with a predetermined distance thereto and excited by the excitation coil 10. A specimen holder device 20 is withdrawably inserted in the space defined between the upper pole piece 16 and the lower pole piece 17.

In the transmission electron microscope of the structure outlined above, many endevors have been made to improve and enhance performances of the microscope. For example, there is realized an electron microscope which exhibits such a high resolving power that atomic structures of solid specimens can be observed and which is thus generally called a high performance electron microscope. In the high performance electron microscope, aberrations of the objective lens 9 are decreased to possible minimum. For example, in the electron microscope in which the electron beam is accelerated at an accelerating voltage of 100 kV, spherical aberration Cs as well as chromatic aberration Cc of the objective lens is of the order of 1 mm (millimeter).

In this connection, the resolving power of the objective lens which plays a determinantive role in determination of performance of an electron microscope can theoritically be expressed as follows:

$$\delta = 0.65 \, C_s^{\frac{1}{4}} \lambda^{\frac{3}{4}} \quad (1)$$

where $\delta$: revolving power (mm), $C_s$: spherical aberration (mm) of an objective lens, and $\lambda$: wavelength of accelerated electron beam (mm).

As will be appreciated from the above expression, the wavelength of the electron beam must be shortened by increasing the accelerating voltage or the spherical aberration Cs has to be much decreased, in order to produce an image of atomic structure of a solid specimen with high fidelity. In the present state of the electron microscopes, the maximum resolving power is attained at 1000 kV (kilovolts) at which the wavelength $\lambda$ of the electron beam is $8.7 \times 10^{-3}$ Å, while the spherical aberration Cs is in the range of 2 to 3 mm.

In order to shorten the wavelength $\lambda$ of the electron beam, the electron beam accelerating voltage has to be considerably increased, which means that intolerably high manufacturing cost will be involved. Under the circumstances, the number of the high performance electron microscopes manufactured in a year which allows the accelerating voltage of 1000 kV to be used amounts only to one or two over the whole world. Accordingly, if the resolving power of the electron microscope is to be increased without being accompanied by the economical difficulty, the spherical aberration Cs has to be reduced, as will be apparent from the expression (1). The most conceivable measures for reducing the spherical aberration will be to decrease the distance between the specimen supported on the specimen holder device 20 and the magnetic pole pieces of the objective lens 9 (this distance is referred to as the working distance) by decreasing correspondingly the distance between the upper and the lower magnetic poles (16, 17). This approach however gives rise to a new problem which will be described below.

In the first place, it should be noted that a specimen holding or supporting portion of the specimen holder device 20 is at least 2 mm in thickness as viewed in the axial direction of the microscope. This thickness of this order is inevitable in consideration of the fact that a specimen mesh is fixedly disposed on the holding portion, a manipulating member for inclining or angularly positioning the specimen must be provided, and that the specimen holder should exhibit a sufficiently high antivibration capacity for attaining the high resolving power which allows a specimen image to be observed at the atomic level. Since the specimen holder device 20 is placed in and removed from the inter-pole gap of the objective lens 9 in the direction traversing the optical axis of the electron microscope (a so-called side entry system), the inter-pole gap of the objective lens 9 (i.e. the distance or space between the upper and the lower pole pieces of the objective lens) can not be decreased to a value smaller than 2 mm. For this reason, the value of the inter-pole distance is about 2 mm at the shortest in the hitherto known electron microscope. In other words, no attempts have been made to make the inter-pole gap of the objective lens smaller than 2 mm. Under the circumstance, the spherical aberration Cs of the objective lens 9 which is smaller than 1 mm is not realized, although it can be attained by decreasing the inter-pole gap below 2 mm.

As an approach to solve the problem mentioned above, there is known a so-called top entry system in which the specimen holder is placed in and withdrawn from the inter-pole gap of the objective lens 9 along the optical axis through the bore 7 of the upper pole piece 16 or the lower pole piece 17. With this arrangement, the inter-pole gap of the objective lens can certainly be decreased. However, the diameter of the bore 7 formed in the pole piece must then be greater than 5 mm in practical applications, which in turn results in that the spherical aberration becomes undesirably significant, to another disadvantage.

SUMMARY OF THE INVENTION

It is an object of the present invention to provide a specimen holder for an electron beam apparatus which can be inserted in and withdrawn from an inter-pole gap of an objective lens decreased to less than 2 mm, while assuring the positive holding of a specimen mesh as well as a specimen and which is imparted with an adequate rigidity and vibration insensitivity.

It is another object of the present invention to provide a specimen holder for an electron beam apparatus which can be withdrawably inserted in an inter-pole gap of an objective lens decreased to a possible minimum and which is provided with a specimen holding portion and a specimen inclining member for angularly positioning the specimen holder within the inter-pole gap of the objective lens.

In view of the above objects, there is provided according to an aspect of the present invention a specimen holder for an electron beam apparatus in which a specimen holding portion or member disposed at a leading end of the specimen holder (as viewed in the direction in which the latter is inserted) is reduced in thickness at a region which traverses between opposite top ends of the magnetic pole pieces of the objective lens upon insertion of the specimen holder, as compared with other region, so that the specimen holder can be easily inserted in and withdrawn from the narrowed inter-pole gap of the objective. In a preferred embodiment of the invention, a hole having a diameter greater than that of the top end of the magnetic pole is formed in the specimen holding portion at a region which is located between the opposite magnetic poles in the inserted state of the specimen holder, while a groove-like recess of a predetermined width is formed so as to extend from the leading end of the specimen holding portion to the hole. The specimen mesh is fixedly placed within the hole. The thin region resulting from formation of the recess may have a thickness of the order of 0.5 mm while the other region may be 2 mm or more in thickness, as is in the case of the hitherto known specimen holder. Since the thickness of the specimen mesh is of the order of 0.2 mm, insertion and removal of the specimen holder can be performed without any appreciable difficulty even when the inter-pole gap of the objective lens is smaller than 2 mm. Degradation in mechanical rigidity and vibration insensitivity due to the provision of the thin region can be substantially prevented by making the other region relatively thicker. The specimen can be inclined by correspondingly rotating a holding rod constituting a part of the specimen holder. In another preferred embodiment, an opening of a predetermined shape is formed in the specimen holding portion, wherein a plate having a hole corresponding to the aforementioned one is inclinably mounted in the opening and connected to the specimen inclining member at a location externally of the inter-pole gap so as to be inclined in the direction which differs from that of inclination realized through rotation of the holder rod.

DETAILED DESCRIPTION OF THE PREFERRED EMBODIMENTS

Now, the invention will be described in detail in conjunction with exemplary embodiments thereof shown in the drawings.

Figure 2:
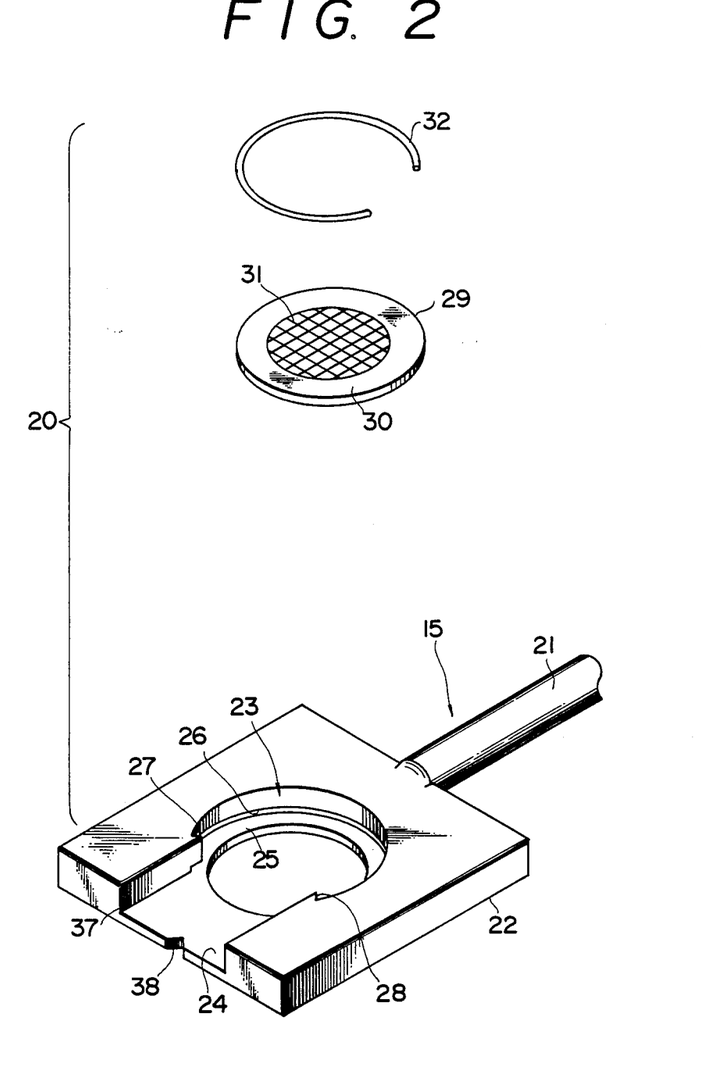
FIG. 2 is a perspective view showing in an exploded state a specimen holder device for an electron beam apparatus according to a first embodiment of the present invention.
Figure 3:
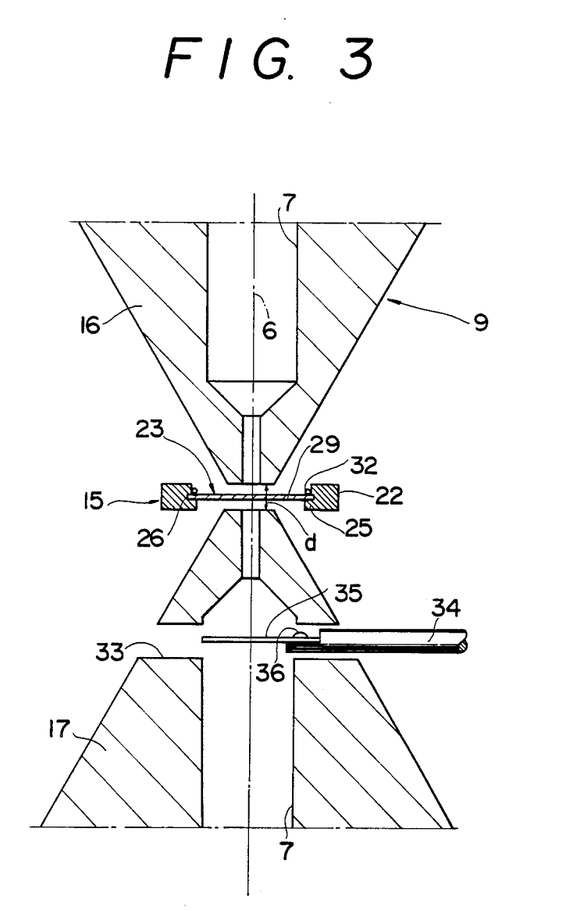
FIG. 3 is a sectional view showing the specimen holder device according to the first embodiment in the state inserted in an inter-pole gap of an objective lens.
Figure 4:
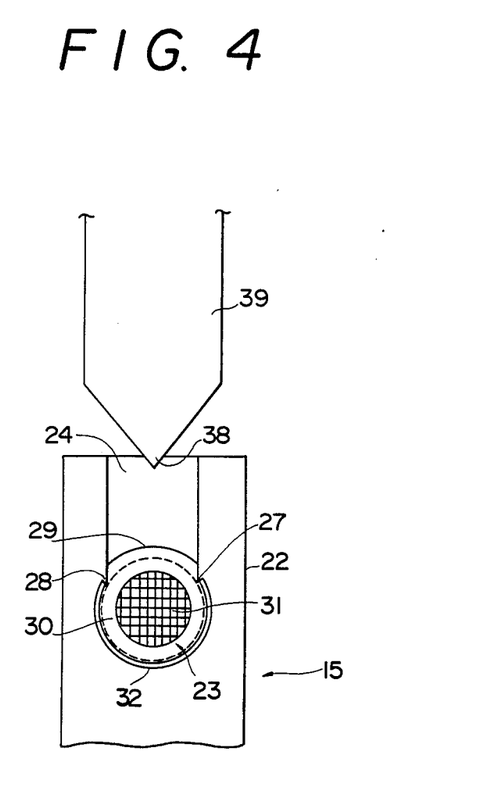
FIG. 4 is a plan view showing the specimen holding device according to the first embodiment in the state inserted in the inter-pole gap of the objective lens.

Referring to FIGS. 2 to 4 which show a specimen holder device according to a first embodiment of the invention, the specimen holder device generally designated by a reference number 20 comprises a specimen holder 15, a specimen mesh 29 disposed on the specimen holder 15 and a ring-like mesh retaining spring 32 for retaining fixedly the specimen mesh 29. The specimen holder 15 is composed of a holding rod 21 which is rotatably supported in a side wall of a microscope column 1 and a specimen holding portion 22 formed integrally with the holding rod 21 at an end thereof. There is formed in the specimen holding portion 22 substantially at a center thereof a through-hole 23 of a circular shape which has a diameter greater than that of the end face of the magnetic pole pieces of the objective lens. An annular ledge 25 is formed at the lower end of the hole 23 so as to extend radially inwardly from the inner peripheral wall of the hole 23. Further, a peripheral groove 26 is formed in the side wall of the hole 23. The holding rod 21 of the specimen holder 15 is of a cylindrical configuration so that it can be rotated about the longitudinal axis thereof. On the other hand, the specimen holding portion 22 is in a form of a plate having an overall thickness of 2 to 3 mm. A recess 37 of a predetermined width is formed in the specimen holding portion 22 which extends from the hole 23 to the free or front edge (as viewed in FIG. 2) of the specimen holding portion 22, as the result of which a thin region 24 of about 0.5 mm in thickness is formed in the front end of the holding portion 22. Retaining edges 27 and 28 are formed at both rear ends of the recess 37, respectively, and project radially inwardly above the groove 26 as well as the ledge 25. Further, a notch 38 is formed substantially at a mid portion of the thin region 24 as viewed widthwise.

The specimen mesh 29 is constituted by a specimen supporting portion 31 of a mesh structure so that the electron beam can transmit therethrough and an annular mounting member 30 of a synthetic resin for mounting the mesh 29 in the enclosed state. The specimen mesh 29 is about 0.2 mm thick. This specimen mesh 29 is disposed on the ledge 25 of the holding portion with the outer peripheral edge thereof being fitted in the groove 26. Further, the retaining spring 32 is press-fitted on the specimen mesh 29 and held fixedly by the retaining edges 27 and 28 which receive therein the ends of the ring-like spring 32, respectively. The specimen mesh 29 is pressed onto the ledge 25 under the action of the spring ring 32.

On the other hand, the upper and the lower magnetic pole pieces 16 and 17 of the objective lens 9 are realized in a form of frustam having a relatively great angle of inclination on the order of 60° and disposed in opposition to each other, as is shown in FIG. 3. The gap distance d between the upper and the lower pole pieces 16 and 17 is selected at a very small value in the range of 1.3 to 1.5 mm. Formed in the lower pole piece 17 at a position spaced from the top end thereof by a predetermined distance is a passage 33 which extends in the direction perpendicular to the optical axis 6 and has a diameter of ca. 1.5 mm. This passage 33 is adapted to receive therein an objective aperture member 35 secured to a supporting rod 34 by means of screws 36.

In operation of the electron microscope provided with the specimen holder of the structure described above, a specimen to be examined is disposed on the specimen mesh 29, and the specimen holder 15 is inserted and displaced toward the inter-pole gap in the direction perpendicular to the optical axis 6. Since the thin region 24 is formed in the leading end portion of the specimen holder 15, the thickness of that portion of the holder which is placed between the magnetic pole pieces of the objective lens 9 does not exceed 1 mm even when the thickness of the specimen mesh 29 mounted on the holding portion 22 and that of the specimen are taken into account. Thus, the specimen holder can be inserted in the inter-pole gap of very small dimension and so manipulated that the center of the specimen mesh 29 is aligned with the optical axis. When the specimen holder 15 has been moved to the predetermined position, the notch 38 formed in the thin region 24 is engaged by a wedge-like member 39 which is fixedly mounted at the opposite position on the inner side wall of the microscope column 1, whereby the specimen holder 15 is supported stably.

In an experimental observation, an electron microscope in which the diameter of the bore formed in the upper and the lower pole pieces 16 and 17 is 0.7 mm, the inter-pole gap d is 1.3 mm, the diameter of the pole end face is 2 mm and the internal angle at the apex of the pole piece is 60° was operated with the accelerating voltage of 100 kV. The spherical aberration was ca. 0.3 mm. Bright field image, dark field image and electron diffraction image could be obtained through corresponding manipulation of the objective aperture as easily as in the case of the conventional objective lens structure. It has thus been established that an atomic structure of a specimen can be observed with improved resolution without need for increasing the voltage for accelerating the electron beam. The specimen can be inclined by rotating the holding rod 21 about the center axis thereof. Since the hole 23 has a greater diameter than that of the magnetic pole end face, the specimen can be inclined at desired angles in the range of ±15° without bringing about interference between the thick region of the holding portion 22 and the magnetic poles (16, 17) of the objective lens.

As a modification of the first embodiment described above, the thin region 24 formed in the leading or front end portion of the specimen holder 15 can be completely cut out. In this case, the specimen holder 15 may be supported in a cantilever-like manner.

Figure 5:
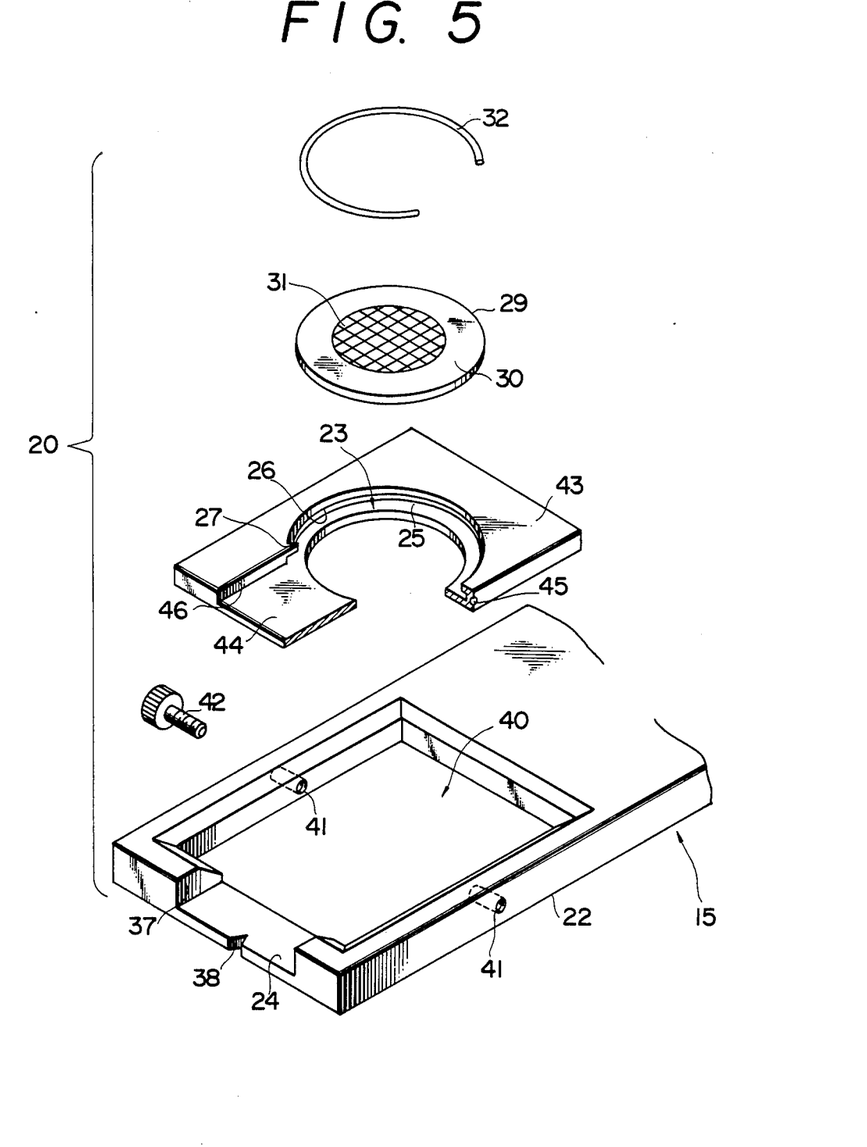
FIG. 5 is a perspective view showing in an exploded state a specimen holder device for an electron beam apparatus according to a second embodiment of the present invention.
Figure 6:
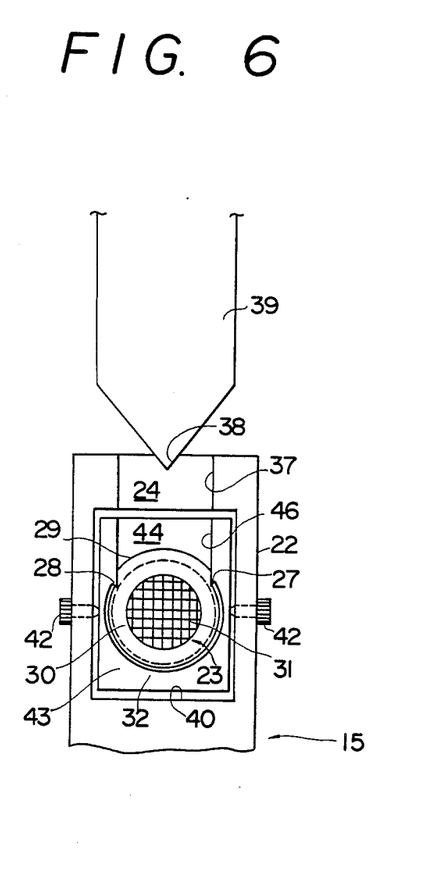
FIG. 6 is a plan view showing the specimen holder device according to the second embodiment of the invention in the state inserted in an interpole gap of an objective lens.

FIGS. 5 and 6 show a second embodiment of the invention, according to which a frame-like specimen holder 15 has a rectangular socket opening 40 formed in the holding portion 22. A pair of threaded holes 41 are formed in the side walls defining the opening 40 in opposition to each other. An inclinable supporting plate 43 of appropriate shape and size is disposed within the opening 40 and swingably supported by screws 42 threaded through the threaded holes 41 and engaged in sockets 45 formed at both sides of the plate 43. A circular opening 23 of a diameter greater than that of the pole end face is formed in the inclinable supporting plate 43 and is provided with the ledge 25 and the groove 26 in the same manner as in the case of the first embodiment. Further, a recess 37 is formed in the leading side portion of the rectangular frame-like holding member 22, whereby a thin region 24 is realized. A notch 38 is also formed in the thin region 24. On the other hand, a recess 46 and a thin region 44 are formed in the inclinable supporting plate 43 so as to be aligned with the recess 37 and the thin region 24 of the rectangular holding frame 22 in the assembled state. Further, a pair of retaining edges 27 and 28 are formed at the rear ends of the recess 46. The structure of the specimen mesh 29 and the mesh retaining ring 32 are same as those of the first embodiment and mounted on the supporting plate 43 in the same manner as described hereinbefore.

With the structure of the specimen holder device 20 described above, that portion of the specimen holder 15 which is placed in the inter-pole gap is at most 1 mm in thickness even when the thickness of the specimen mesh 29 and a specimen are taken into account. Accordingly, the specimen holder 15 can be easily inserted in the extremely small inter-pole gap of the objective lens. The specimen can be inclined not only around one axis (e.g. X-axis) by rotating the holding rod 21 but also inclined around the other axis (e.g. Y-axis) extending perpendicularly to the former by rotating the set screws 42. Thus, a specimen can be observed in more various orientations when compared with the first embodiment.

In the foregoing description, it has been assumed that the specimen holder device in concern is adapted to place and hold a specimen in an inter-pole gap of an objective lens of a transmission electron microscope. In this connection, it should be noted that a scanning electron microscope may require insertion of a specimen in the inter-pole gap of the objective lens for the purpose of enhancing the resolution. In such case, the invention can equally be applied to the specimen holder device for the scanning electron microscope. Further, the invention can be applied to other types of electron beam apparatus having similar functions as the electron microscope.

The present invention has now provided a specimen holder device for an electron microscope which can be easily inserted into and withdrawn from a gap of an extremely reduced size defined between upper and lower pole pieces of the objective lens by virtue of such arrangement that an opening of a greater diameter than that of the pole end face is formed for receiving therein a specimen mesh and that a thin region is provided at that portion of the holder which is caused to pass between the pole pieces of the objective lens upon insertion of a specimen in the inter-pole gap. The resolving power of the electron microscope can be improved due to the extremely narrowed inter-pole gap of the objective lens. Further, since the specimen holder can be freely inclined at desired angles in a predetermined range, observation of a specimen can be effected at various orientations. Besides, disposition of the objective aperture within the magnetic pole at a position distanced considerably from the inter-pole gap allows effective utilization of the latter.

We claim:

1. An electron beam apparatus comprising:

an electron gun;

a condenser lens disposed below said electron gun;

an objective lens comprising magnetizing coils disposed below said condenser an upper magnetic pole, and a lower magnetic pole disposed below and in opposition to said upper magnetic pole with a minimum inter-pole gap therebetween, both of said poles being in a form of a frustum having a relatively large angle of inclination;

an intermediate lens disposed below said objective lens; and a specimen holder device for withdrawably inserting a specimen in a minimum inter-pole gap between the upper and lower magnetic poles, said specimen holder comprising a rod-like holding member, a frame-like specimen holding member having a socket opening mounted on said rod-like member at an end thereof, a support plate disposed with the socket opening and supported on said frame-like member inclinably about an axis which intersects the center axis of said rod-like member, wherein an opening of a diameter sufficiently larger than that of the end face of said upper and lower magnetic poles is formed in said support plate for stably accommodating therein a specimen mesh on which said specimen is disposed, and a recess formed in said frame-like specimen holding member and the supporting plate at that portion which is caused to pass between said magnetic poles upon insertion and withdrawal of said specimen, said recess extending continuously to said opening, whereby the specimen can be selectively inclined in the minimum inter-pole gap about both the center axis of said rod-like member and the axis intersecting the center axis thereof.

2. An electron beam apparatus according to claim 1, wherein said frame-like support member is located outside of said inter-pole gap of said objective lens when said specimen is positioned at said inter-pole gap.

3. An electron beam apparatus according to claim 1 or 2, wherein a thin region resulting from formation of the recess in said frame-like support member has a thickness which is not greater than one millimeter, while the remaining region of said frame-like support member has a thickness which is not smaller than two millimeters.

4. An electron beam apparatus according to claim 3, wherein said recess is completely hollow so that said thin region is absent.

5. An electron beam apparatus according to claim 1, wherein said inter-pole gap is not greater than two millimeters.

6. An electron beam apparatus according to claim 1, wherein said specimen mesh has a greater outer diameter than that of the end face of said magnetic pole of said objective lens, and includes a center portion of a mesh structure destined for supporting thereon a specimen and outer supporting frame for supporting said mesh structure.

7. An electron beam apparatus according to claim 6, wherein an inserting hole is formed in said lower magnetic pole at a location distanced adequately from the top end thereof and extends in a direction perpendicular to the optical axis of said electron beam apparatus, an objective aperture element being removably inserted through said insertion hole.

* * * * *